(12) United States Patent
Adan

(10) Patent No.: US 6,720,621 B1
(45) Date of Patent: Apr. 13, 2004

(54) SOI SEMICONDUCTOR DEVICE WITH RESISTOR BODY

(75) Inventor: Alberto Oscar Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 214 days.

(21) Appl. No.: 09/667,530

(22) Filed: Sep. 22, 2000

(30) Foreign Application Priority Data

Nov. 12, 1999  (JP) .............................................. 11-322772

(51) Int. Cl.⁷ .......................... H01L 27/01; H01L 29/00
(52) U.S. Cl. ........................ 257/350; 257/516; 257/538; 257/543
(58) Field of Search ................................. 257/350, 536, 257/537, 538, 543, 595, 602, 516, 288

(56) References Cited

U.S. PATENT DOCUMENTS

| | | |
|---|---|---|
| 3,683,491 A | 8/1972 | Nelson et al. |
| 4,263,518 A | 4/1981 | Ballatore et al. |
| 4,510,517 A | 4/1985 | Tanabe et al. |
| 5,767,757 A | 6/1998 | Prentice |
| 5,872,381 A | 2/1999 | Kato et al. |
| 5,930,638 A | 7/1999 | Reedy et al. |
| 5,949,115 A | 9/1999 | Yamazaki et al. |
| 6,100,565 A | 8/2000 | Ueda |
| 6,180,984 B1 * | 1/2001 | Golke et al. ................. 257/350 |

FOREIGN PATENT DOCUMENTS

| | | |
|---|---|---|
| JP | 61-198912 | 9/1986 |
| JP | 02-039563 | 2/1990 |
| JP | 4-67666 | 3/1992 |
| JP | 4-93160 | 8/1992 |
| JP | 5-114699 | 5/1993 |
| JP | 7-58291 | 3/1995 |
| JP | 09-064320 | 3/1997 |
| JP | 9-181262 | 7/1997 |
| JP | 9-232522 | 9/1997 |
| JP | 11-74531 | 3/1999 |

OTHER PUBLICATIONS

Japanese Office Action dated Aug. 12, 2003.
Copy of EP Search Report dated Jun. 5, 2003.

* cited by examiner

Primary Examiner—Minh Loan Tran
(74) Attorney, Agent, or Firm—Nixon & Vanderhye P.C.

(57) ABSTRACT

A SOI semiconductor device comprises a resistor body which is formed of a top semiconductor layer in a SOI substrate having an embedded dielectric film and the top semiconductor layer formed on the embedded dielectric film and which is dielectrically isolated by an insulating film, wherein a resistance value of the resistor body is set to be a predetermined value by the concentration of impurities contained in the top semiconductor layer and by the dimension of the resistor body.

12 Claims, 7 Drawing Sheets

SOI SEMICONDUCTOR DEVICE WITH RESISTOR BODY

CROSS-REFERENCE TO RELATED APPLICATION

This application is related to Japanese application No. HEI 11(1999)-322772 filed on Nov. 12, 1999, whose priority is claimed under 35 USC §119, the disclosure of which is incorporated by reference in its entirety.

BACKGROUND OF THE INVENTION

1. Field of the Invention

The present invention relates to a SOI semiconductor device and a fabrication process thereof. More particularly, the present invention relates to a SOI semiconductor device of a voltage control type formed on a SOI substrate, and a fabrication process thereof.

2. Description of Related Art

Resistors and capacitors are commonly used in electric circuits for dealing with analogue signals, such as filters and RC delay lines. In an integrated circuit, the resistor is typically implemented with a diffusion layer formed in a semiconductor substrate or a conductive layer such as a gate electrode of polysilicon, as a passive resistor. The capacitor is utilized gate capacitance of the MOS transistor, junction capacitance, capacitance between two conductive layers isolated by a dielectric film, and the like.

As shown in FIG. 7(a), for example, a MOS transistor is used as a variable resistance element. Voltage Vc is applied to a gate electrode 30 formed on a p-type semiconductor substrate 33, and voltages Vi and Vo are applied to diffusion layers 31 which are source/drain regions, respectively. By varying the gate voltage Vc so that (Vo−Vi)<<(Vc−Vth), the resistance value of a channel 34 can be changed. The MOS transistor, when used as a variable resistance element, can also serve as a capacitor due to a gate oxide 32 sandwiched between the gate electrode 30 and the semiconductor substrate 33. Accordingly, an RC circuit can be constituted by combining the resistance with the capacitance.

Japanese Unexamined Patent Publication No. HEI 9(1997)-232522 proposes the use of a junction FET (JFET) 40 formed on a bulk semiconductor substrate, as a variable resistance element. A resistance element 43 is connected between source/drain terminals 41 and 42 of the JFET 40, so that the JFET, free from the influence of a bias voltage between the source/drain regions, can be used as a variable resistance element, which shows a substantially constant resistance value under a gate bias voltage.

For conventional resistors and capacitors as mentioned above, however, the resistor and capacitor values can not be electrically adjusted. The value of a resistance using a channel in the MOS transistor depends on the mobility of electric charge in an inversion layer, which is subject to the resistor surface condition and interface imperfections. Also, their values are determined by the physical characteristics of material used and the design of circuits. Therefore, the resistor and capacitor are passive in a sense.

Furthermore, the variable range of the resistance value is restricted when the channel of the MOS transistor is used as a resistor. This is because the range of voltage showing the linear portion of the I–(Vo–Vi) curve is small, as shown by the relation between the electric current and the voltage (Vo−Vi) applied to the diffusion layers 31 of the MOS transistor and by the following formula:

$$I = \beta \times \left( Vc - Vth = \frac{1}{2} \cdot (Vo - Vi) \right) \cdot (Vo - Vi) \approx \beta \times (Vc - Vth) \cdot (Vo - Vi)$$

$$R \cong \frac{1}{\beta \times (Vc - Vth)}$$

The JFET 40, shown in FIG. 8, also has the same drawback that the linear portion of the I–(Vo–Vi) curve is limited to a narrow range.

SUMMARY OF THE INVENTION

The present invention is conceived in view of the above circumstances and an object thereof is to provide a SOI semiconductor having a variable resistance element whose resistance value can be varied greatly, i.e., having a control electrode by which its electric characteristics can be controlled.

Accordingly, the present invention provides a SOI semiconductor device comprising: a resistor body which is formed of a top semiconductor layer in a SOI substrate having an embedded dielectric film and the top semiconductor layer formed on the embedded dielectric film and which is dielectrically isolated by an insulating film, wherein a resistance value of the resistor body is set to be a predetermined value by the concentration of impurities contained in the top semiconductor layer and by the dimension of the resistor body.

Also, the present invention provides a process of fabricating a SOI semiconductor device comprising the step of: setting a top semiconductor layer in a SOI substrate having an embedded dielectric film and the top semiconductor layer formed on the embedded dielectric film to have a predetermined impurity concentration and a predetermined dimension, thereby controlling a resistance value of a resistor body formed of the top semiconductor layer.

Furthermore, the present invention provides a SOI semiconductor device comprising: an electrically variable resistor body which is formed of a top semiconductor layer in a SOI substrate having an embedded dielectric film and the top semiconductor layer formed on the embedded dielectric film and which has a control electrode disposed on the top semiconductor layer with intervention of a dielectric film, wherein the resistor body is partially depleted by the control electrode to form a neutral region through which electric current flows, the resistor body has highly concentrated diffusion layers of a first conductive type at both ends in a conduction direction, and both side walls of the resistor body along the conduction direction are junction-isolated by highly concentrated diffusion layers of a second type.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

Figure 1A:
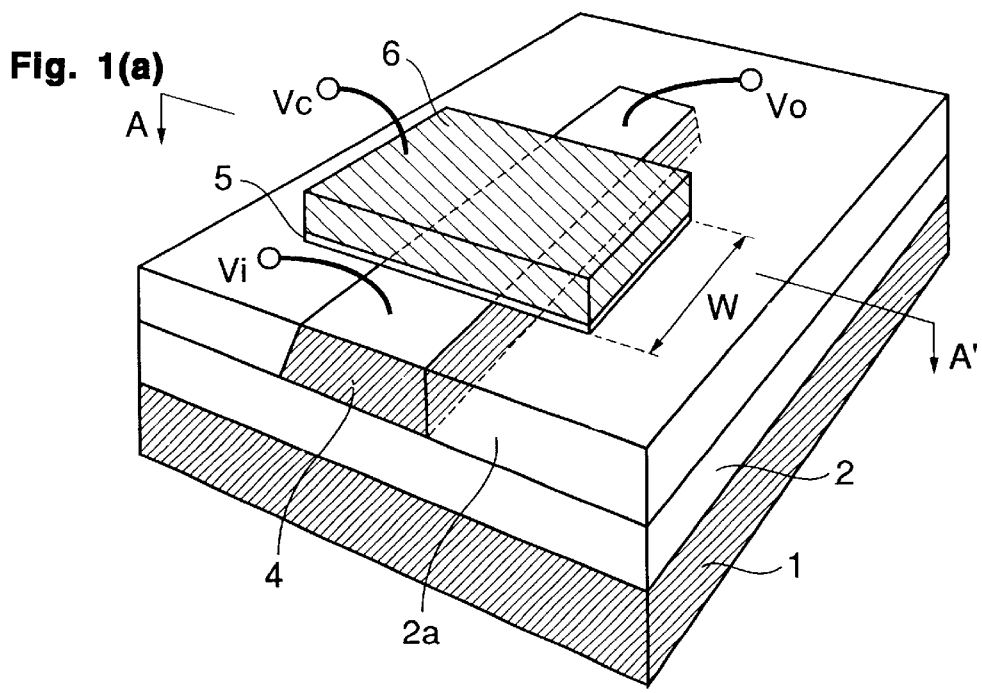
FIGS. 1(a) to 1(c) are a schematic perspective view, a schematic cross-sectional view and a circuit diagram, respectively, showing an essential portion of a SOI semiconductor device of the present invention.

A SOI semiconductor device of the present invention can serve as a so-called variable resistance element formed on a SOI substrate. Also, it can serve as an RC delay line by the connection of the resistance element to a capacitance formed in the device.

The SOI substrate employed in the present invention typically comprises an embedded dielectric film and a top semiconductor layer formed on the embedded dielectric film. Usually, the embedded dielectric film is overlay on a supporting substrate. The SOI substrate may be a substrate used as a bonded SOI (BESOI) or SIMOX (Separation by Implantation of Oxygen) type substrate, or the like.

The supporting substrate may be selected from a variety of substrates such as an elementary semiconductor substrate of silicon, germanium or the like, a compound semiconductor substrate of GaAs, InGaAs or the like, and an insulating substrate of sapphire, quartz, glass, plastic or the like. Here, the supporting substrate may include elements such as transistors or capacitors or the like, or circuits, formed on the supporting substrate.

The embedded dielectric film may be, for example, a $SiO_2$ or a SiN film. The thickness of the embedded dielectric film may be properly adjusted by considering the characteristics of semiconductor device to be obtained, the magnitude of the applied voltage in using the obtained semiconductor device. The thickness of the embedded dielectric film may be about 50 nm to about 400 nm, for example.

Typically, the top semiconductor layer is a semiconductor thin film which serves as an active layer for forming a transistor, and, in the present invention, it constitutes a resistor body itself. This top semiconductor layer may be formed of a thin film of an elementary semiconductor such as silicon or germanium, a compound semiconductor such as GaAs or InGaAs. Among these, a silicon thin film is preferred.

In a first SOI semiconductor device of the present invention, the resistor body is formed of the top semiconductor layer. The resistor body is dielectrically isolated by an insulating film and is set to have an appropriate dimension and an appropriate impurity concentration to obtain a desired resistance value ($\Omega$). The dimension of the resistor body is determined by a film thickness T, a width W and a length La, which are properly set in accordance with the resistance value of the resistor body to be obtained and the design rule. For example, the resistor body may be about 80 nm to about 200 nm thick, about 10 $\mu$m to about 1000 $\mu$m wide and about 0.2 $\mu$m to 10 $\mu$m long. The impurity concentration of the top semiconductor layer for forming the resistor body is not particularly limited, and may be, for example, about $1 \times 10^{17}$ $cm^{-3}$ to about $5 \times 10^{18}$ $cm^{-3}$. By setting the impurity concentration at this range, the specific resistance of the resistor body can be set to be about 0.04 $\Omega \cdot cm$ to about 0.2 $\Omega \cdot cm$. By setting the resistor body at such an impurity concentration and dimension, the resistance value of the resistor body can be controlled to be about 1 k$\Omega$ to about 100 M$\Omega$.

Both ends of the resistor body in the width direction are connected to electrode terminals. In order to reduce the contact resistance created in contact to the electrode terminals, the resistor body has at the ends thereof regions formed of a diffusion layer with p- or n-type impurities diffused at a high concentration. A voltage applied to the electrode terminals may be either positive or negative, but when the conductivity type of the resistor body is a p-type, the voltage is suitably negative. The magnitude of the voltage in this case can be properly adjusted by considering the resistance value to be obtained, and may be, for example, about 0 V to about 5 V.

The insulating film surrounding the resistor body can be a $SiO_2$ film or a SiN film. The formation of this insulating film can be done by a method for device isolation in typical semiconductor processes or the like.

Preferably, on the resistor body is formed a control electrode capacitively coupled with the resistor body via a dielectric film. The material and film thickness of the dielectric film are not particularly limited, but may be the same as those of the gate oxide of typical MOS transistors.

The material and film thickness of the control electrode are not particularly limited, but may be the same as those of the gate electrode of typical MOS transistors. The gate electrode may be formed of a polysilicon to a thickness of about 150 nm to about 300 nm; a silicide with a metal of a high melting point such as W, Ta, Ti, or Mo; a polyside made of such a silicide and a polysilicon; another metal or the like. The size of the control electrode is not particularly limited, but can be properly selected and determined to obtain desired characteristics.

A voltage Vc is applied to the control electrode to partially deplete the resistor body. The control voltage may be either positive or negative, but when the conductivity type of the resistor body is a p-type, a positive voltage is applied and when the conductivity of the resistor body is an n-type, a negative voltage is applied. The width (depth) Wd of the depleted region can be adjusted depending on various parameters such as the magnitude of the voltage applied to the control electrode, the impurity concentration of the resistor body, the condition of capacitive coupling with the control electrode or the film thickness of the gate oxide. Electric current flows through a neutral region formed in the resistor body by partial depletion. Accordingly, the resistance value of the resistor body can be varied by adjusting the magnitude of the voltage applied to the control electrode. This adjustment of the magnitude of the voltage can be properly carried out by considering the resistance value of the resistor body to be obtained or the like, and may be, for example, about 0 V to about 5 V.

In the first SOI semiconductor device of the present invention, the control electrode is capacitively coupled with the top semiconductor layer (resistor body). Accordingly, the resistance value can be electrically varied by combination of the control electrode with the resistor body, and further the timing of the delay of signals can be changed. Therefore, the SOI semiconductor device serves as an RC delay line.

In a second SOI semiconductor device of the present invention, the resistor body is formed of the top semiconductor layer. The film thickness of the top semiconductor layer in this case can be properly set by considering the resistance value to be obtained, and may be, for example, about 80 nm to about 200 nm. The impurity concentration of the top semiconductor layer is preferably set to realize the resistance value to be obtained, and may be, for example, about $1 \times 10^{17}$ cm$^{-3}$ to about $5 \times 10^{18}$ cm$^{-3}$. By setting the impurity concentration at this range, the resistivity value of the top semiconductor layer can be set to be about 0.04 Ω·cm to about 0.2 Ω·cm.

Both ends of the resistor body in the width direction (conduction direction) are connected to electrode terminals. In order to reduce the contact resistance created in contact to the electrode terminals, the resistor body has at the ends thereof regions formed of a diffusion layer with p- or n-type impurities diffused at a high concentration. The impurity concentration in this case is not particularly limited, but may be, for example, in the order of $10^{20}$ cm$^{-3}$ or more. When the conductivity type of the resistor body is an n-type, the voltages Vi and Vo are preferably positive. The magnitude of the voltage in this case can be adjusted by considering the resistance value to be obtained, and may be, for example, about 0 V to about 5 V.

On both side along the width direction, there are diffusion layers with p- or n-type impurities diffused at a high concentration. By the formation of these diffusion layers, the resistor body is junction-isolated. The impurity concentration in this case is not particularly limited, but may be, for example, in the order of $10^{20}$ cm$^{-3}$ or more. These diffusion layers are preferably connected together and then grounded.

Here, a device isolation region may be formed in the top semiconductor layer like typical device isolation in MOS transistors.

On the resistor body is formed a control electrode capacitively coupled with the resistor body via a dielectric film. The material and thickness of the dielectric film may be the same as described above. The adjustment of the voltage applied to the control electrode allows the resistance value of the resistor body to be varied. The magnitude of the voltage in this case can be properly adjusted by considering the resistance value of the resistor body to be obtained or the like, and may be, for example, about 0 V to about 5 V.

In the second SOI semiconductor device of the present invention, the control electrode is capacitively coupled with the top semiconductor layer (resistor body) and this capacitance is connected in parallel to the junction capacitances. By using these capacitances and the resistor body in combination, the resistance value can be electrically varied, and further the timing of the delay of signals can be changed. Accordingly, the SOI semiconductor device serves as an RC delay line.

The SOI semiconductor device of the present invention can be fabricated using a typical technology for MOS processes or CMOS processes as a set of common processes or with suitable modifications so as to make the SOI semiconductor device as the above. The variable resistance value can be optionally designed based on the parameters as above and parameters related to the processes.

Hereafter, embodiments of the SOI semiconductor device and the fabrication process thereof according to the present invention are given with reference with the attached drawings.

Embodiment 1

Figure 1B:
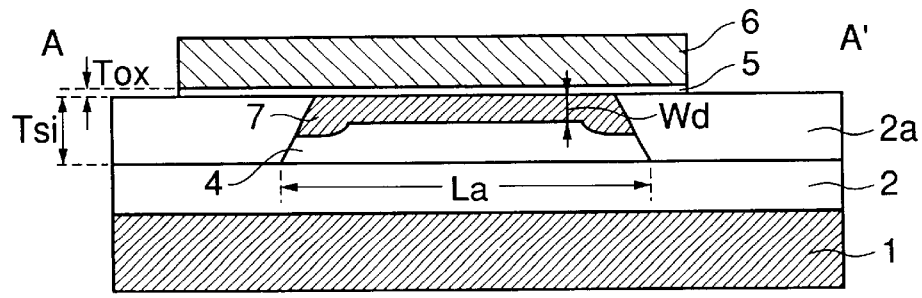
Figure 1C:
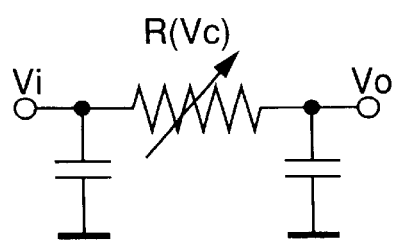

As shown in FIGS. 1(a) to 1(c), the resistor/RC delay line of the SOI semiconductor of this embodiment is constituted such that, in a SOI substrate formed by laminating a silicon substrate 1, an embedded dielectric film 2 and a top silicon layer in this order, the top silicon layer is constructed as a resistor body 4. The resistor body 4 is completely surrounded by a silicon oxide film 2a to be dielectrically isolated. On the resistor body 4 is provided a control electrode 6 which is insulated from and capacitively coupled with the resistor body 4 by a gate 5. The resistor body 4 has at both ends thereof two terminals, to which voltages Vi and Vo are applied, respectively. Voltage Vc is applied to the control electrode 6.

The resistor body 4 is partially depleted by the control electrode 6 and has a specific resistance R determined by a specific resistivity adjusted in accordance with the concentration Na of impurities contained in the top silicon layer and by the width (depth) Wd of a depletion layer induced by the voltage Vc applied to the control electrode. In a neutral region of the resistor body 4 formed by partial depletion, electric current flows from one terminal to the other terminal. The resistance value of the resistor body 4 is controlled by varying the voltage Vc applied to the control electrode 6.

Further, the SOI semiconductor device has a distributed capacitance C between the control electrode 6 and the top silicon layer. As a result, a distributed RC delay line is constituted between the two terminals connected to the resistor body 4, with the delay time controlled by the voltage Vc.

Figure 2A:
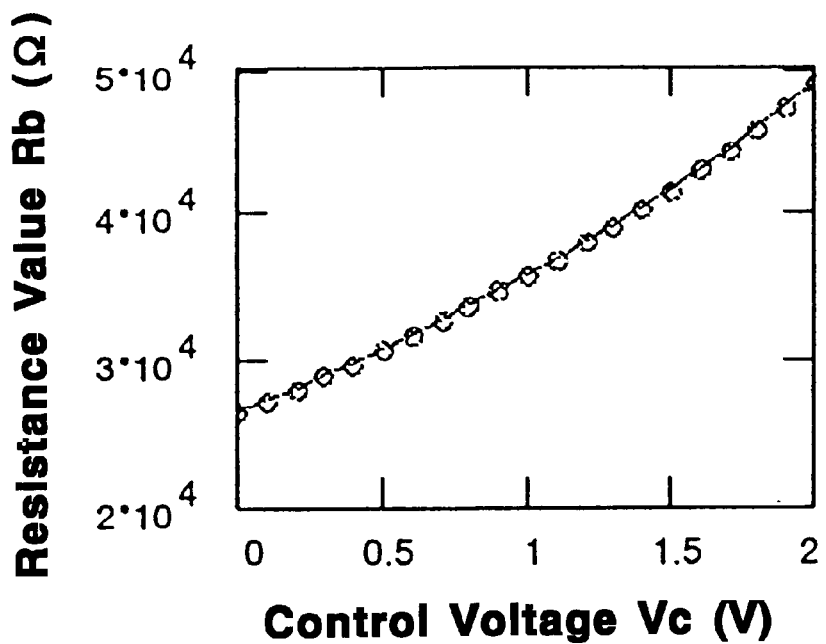
FIG. 2(a) is a chart showing the relation between the resistance Rb and control voltage Vc.

FIG. 2(a) shows the relation between the resistance value Rb and voltage Vc of the above SOI semiconductor device. The SOI semiconductor device has the following parameters: the width W of the resistor body 4 is 100 µm, the length La of the resistor body 4 is 0.5 µm, the impurity concentration Na of the resistor body 4 is $3 \times 10^{17}$ cm$^{-3}$, the film thickness TSi of the resistor body 4 is 150 nm, and Tox of the gate oxide is 7 nm. The resistance value Rb changes from 25 kΩ to 49 kΩ when the voltage Vc changes from 0 V to 2 V.

Figure 2B:
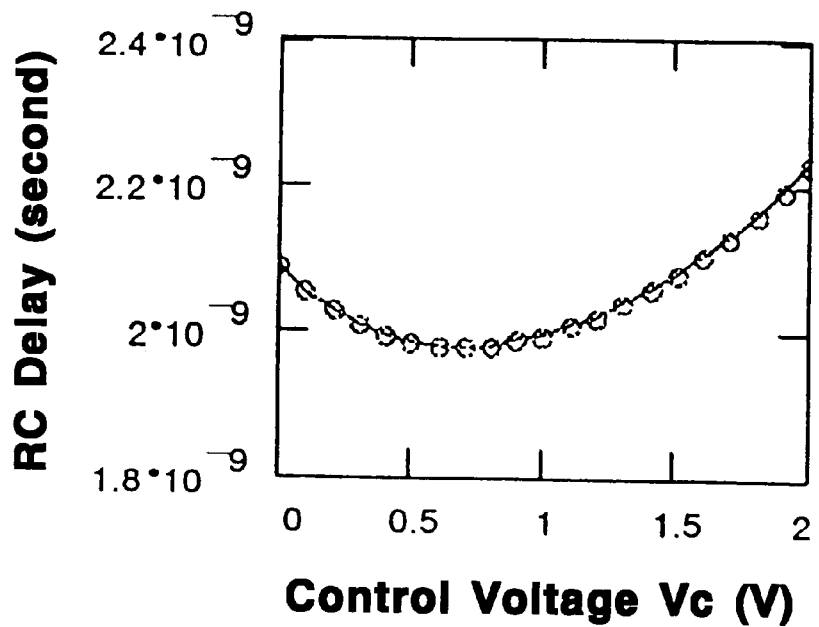
FIG. 2(b) is a chart showing the relation between the RC delay and control voltage Vc, in the SOI semiconductor device of FIG. 1.

Further, as shown in FIG. 2(b), the RC delay is on the increase with a control voltage at 0.8 V or more and it can be used at constant value with a control voltage at 0.6 V or less.

According to the SOI semiconductor device of this embodiment, the resistor body 4 is formed of the top silicon layer with a film thickness TSi and has a depletion layer with a width Wd. Therefore, the neutral region of the resistor body 4 has a film thickness (TSi−Wd). Electric current flows through this neutral region as a conductive channel. This allows the resistor body 4 to have a stable resistance value not affected by the semiconductor layer surface and interface conditions. Also, conduction does not depend on an inversion layer generated by a voltage applied to the control electrode. As a result, the noise can be prevented from increasing without influence by a surface trap effect which could occur in the case of a surface inversion channel transistor. Moreover, there are no parasitic junctions which could create leakage paths. Thus, leakage current can be avoided.

Embodiment 2

Figure 3A:
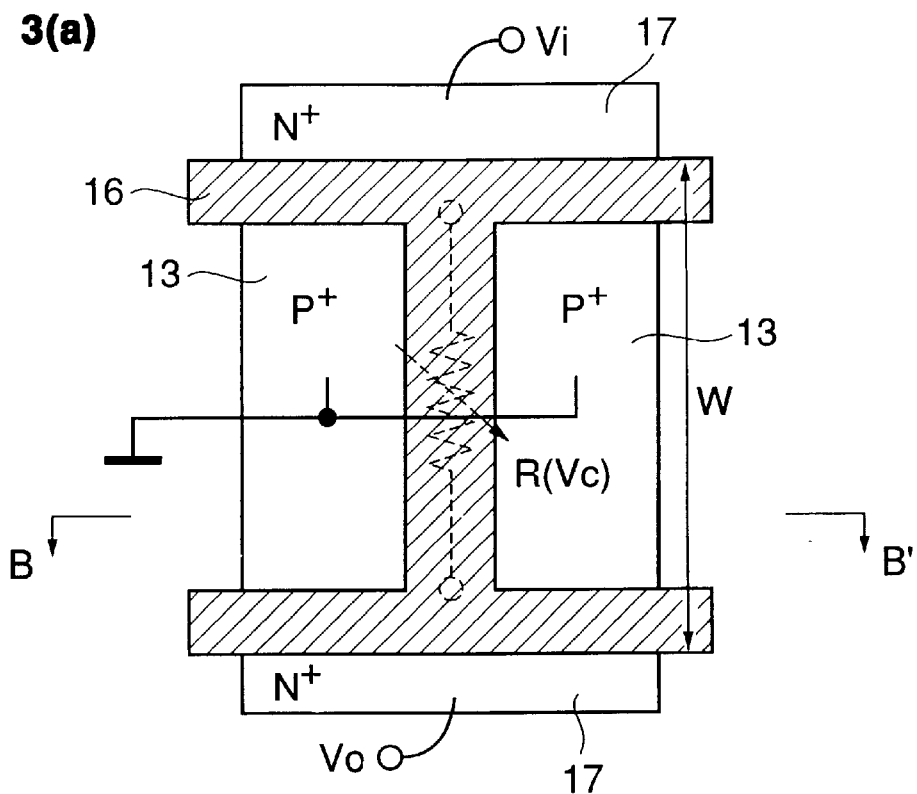
FIGS. 3(a) and 3(b) are a schematic plan view and a schematic cross-sectional view, respectively, showing an essential portion of another SOI semiconductor device of the present invention.
Figure 3B:
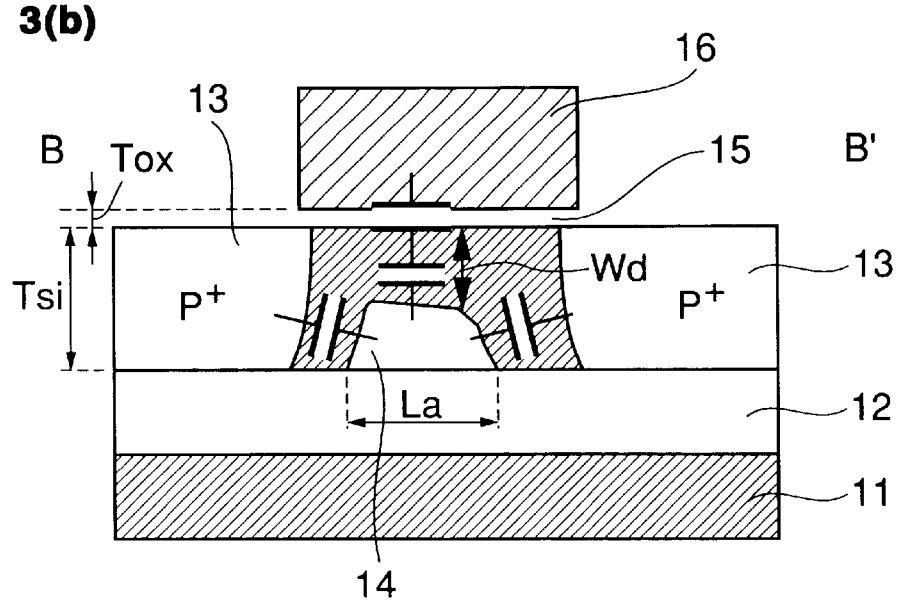

The resistor/RC delay line of the SOI semiconductor of this embodiment is constituted by a SOIMOS device which is partially depleted, as shown in FIGS. 3(a) and 3(b).

A resistor body 14 is provided in a top silicon layer of a SOI substrate formed by laminating an n-type silicon substrate 11, an embedded dielectric film 12 and the top silicon layer in this order. The resistor body 14 is formed by partial depletion induced by a control electrode 16 disposed on the resistor body 14 and is constituted by a neutral region having a channel length W and an effective length La.

The control gate 16 is insulated from and capacitively coupled with the resistor body 14 by a gate oxide 15.

The resistor body 14 has at its ends two terminals formed of a high concentrated n-type diffusion layer 17. Voltages Vi and Vo are applied to the terminals, respectively. Voltage Vc is applied to the control electrode 16. The resistor body 14 is junction-isolated at its side walls from source and drain regions 13, which are made of a high concentrated p-type diffusion layer formed of the top silicon layer. The source and drain regions 13 are connected to each other and then grounded. This leads to prevention of forward bias of the p-n junctions.

In this SOI semiconductor device, the capacitance C between the control electrode 16 and the top silicon layer and the junction capacitances are connected in parallel. As a result, a distributed RC delay line is implemented between the two terminals connected to the resistor body 14, with delay time controlled by the voltage Vc.

Figure 4:
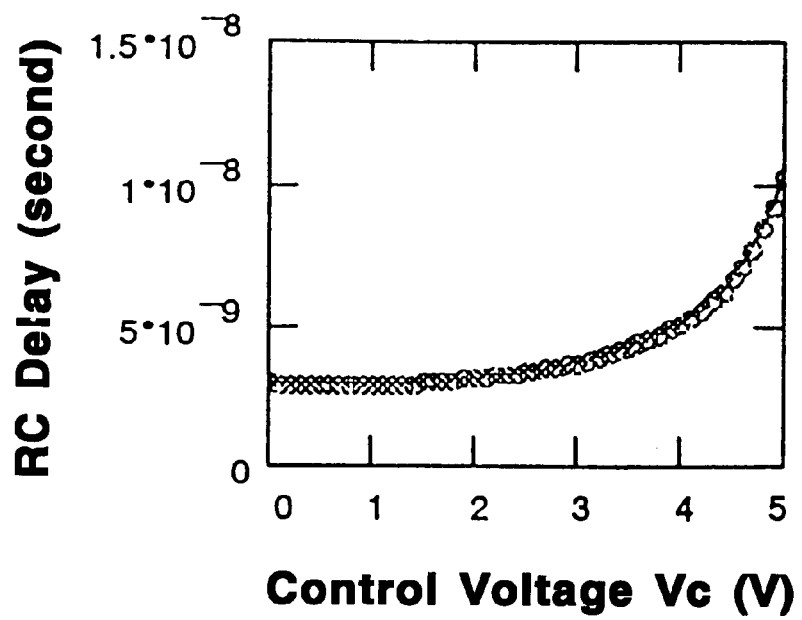
FIG. 4 is a chart showing the relation between the RC delay and control voltage Vc in the SOI semiconductor device of FIG. 3.

When the above SOI semiconductor device is used as an RC delay line or a distributed RC low-pass filter, the RC delay behaves as in FIG. 4. This SOI semiconductor device has the following parameters: W is 100 $\mu$m, La is 0.5 $\mu$m, Na is $3 \times 10^{17}$ cm$^{-3}$, TSi is 150 nm and Tox is 7 nm. The RC delay is on the increase with a control voltage of 1.5 V or more and it can be used at constant value with a control voltage of 1.5 V or less. The junction capacitance in this case is Cj=$3.2 \times 10^{-7}$ F/cm$^2$.

Figure 5:
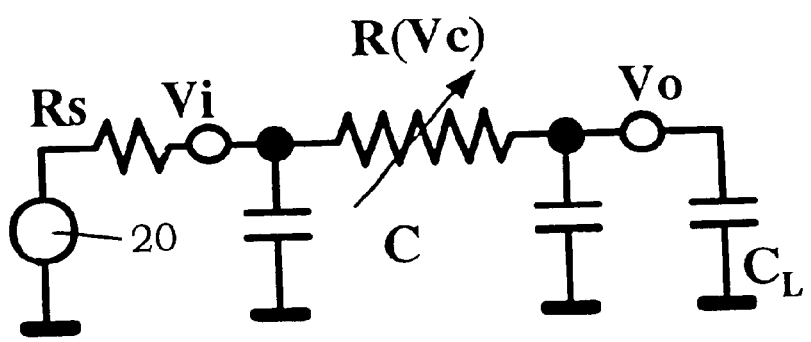
FIG. 5 is a diagram of an RC delay circuit using the SOI semiconductor device of FIG. 3.

When the above SOI semiconductor device is used in a circuit connected with a pulse generator 20, as shown in FIG. 5, the delay time Td is $$Td=R \cdot C \cdot (0.38+0.69 \cdot (Rt \cdot Ct+Rt+Ct)),$$

wherein the total capacitance is C, the resistance is R, Rt is Rs/R, Ct is CL/C, Rs is an input impedance of the pulse generator and CL is a load capacitance.

The RC delay line of the present invention can be used as a common RC delay line. One example is shown in FIG. 6(a).

Figure 6A:
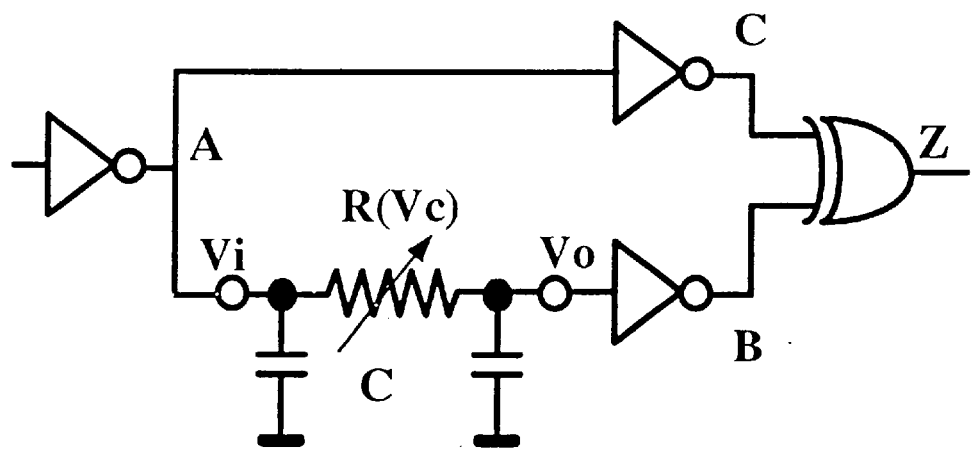
FIG. 6(a) is a circuit diagram showing a pulse generator using the SOI semiconductor device of the present invention.
Figure 6B:
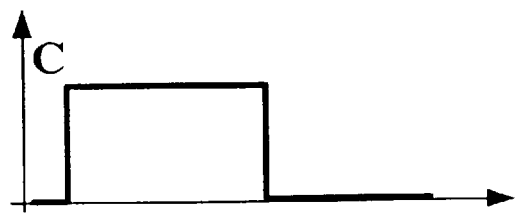
FIG. 6(b) is a waveform of a pulse generated by the pulse generator.
Figure 6B:
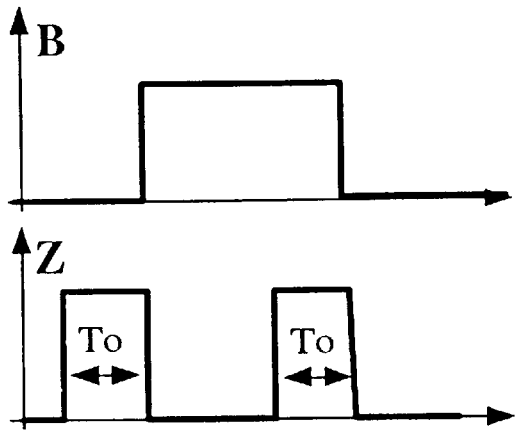
Figure 7A:
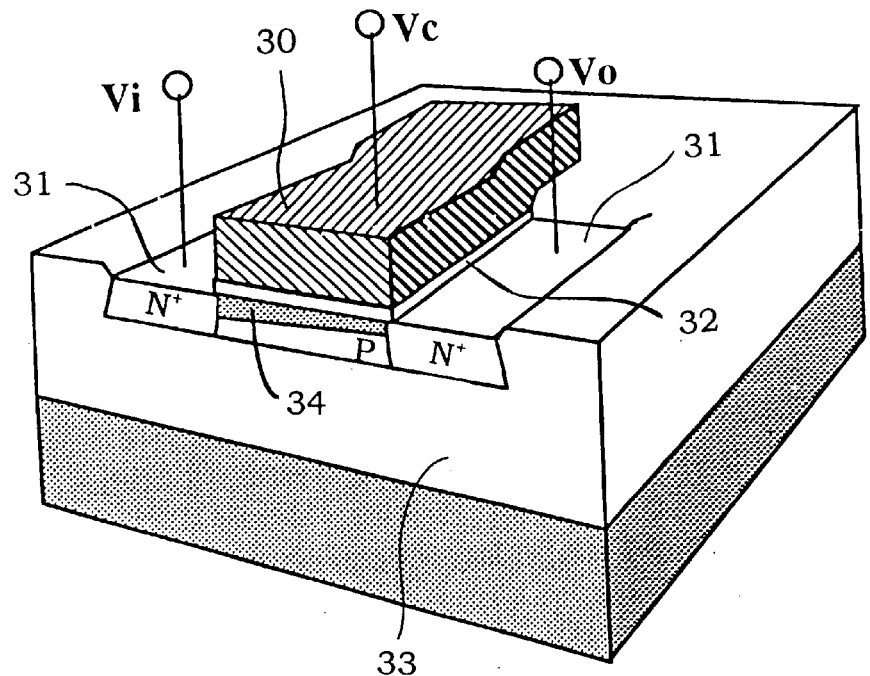
FIG. 7(a) is a schematic perspective view showing an essential portion of a conventional MOS transistor.
Figure 7B:
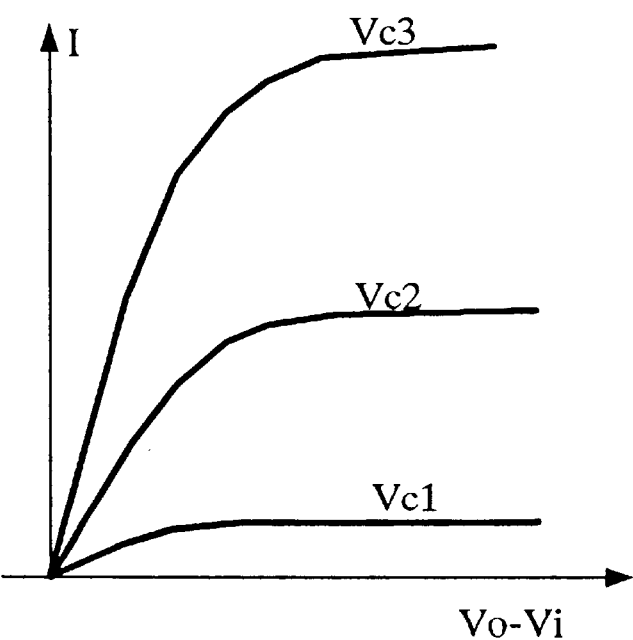
FIG. 7(b) is a chart showing the voltage-current characteristics of the conventional MOS transistor.
Figure 8:
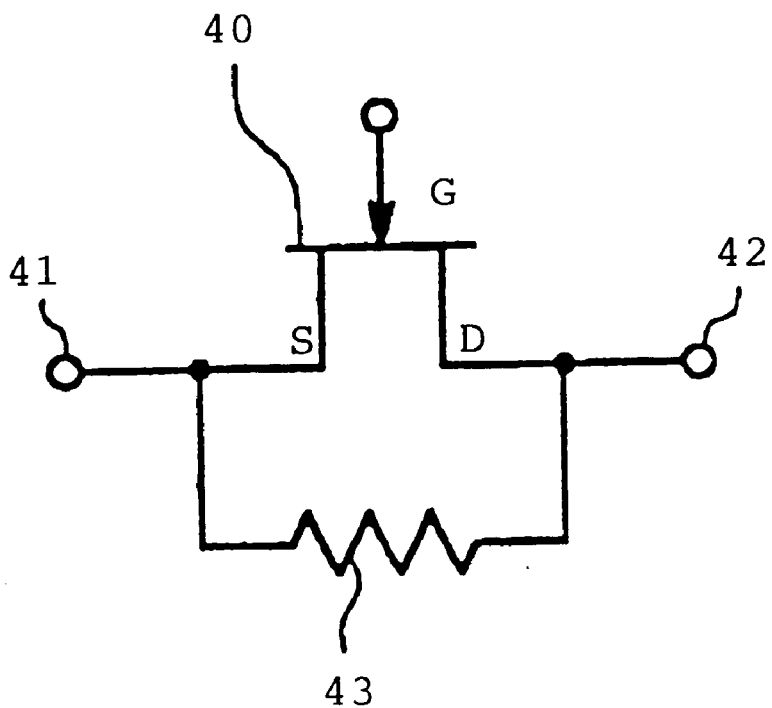
FIG. 8 is a circuit diagram with a conventional JFET used as a variable resistance element.

A pulse generated by the pulse generator is delayed by passing through the RC delay line as shown in FIG. 6(a), and by combining this delayed pulse with an exclusive OR gate, a digital pulse width To is generated. The digital pulse width To can be adjusted by varying the resistance value of the RC delay line.

In accordance with the present invention, the resistor and RC line, which are SOI semiconductor devices, are dielectrically isolated by the insulating film or by junction with the insulating film. Therefore, it is possible to effectively remove leakage currents, the effect of cross-talk, noise coupling from other circuits and the like.

Furthermore, the resistor body in the SOI semiconductor device of the present invention is constructed such that electric current flows through the neutral region formed by partial depletion by the control electrode. Therefore, the resistor body is not affected by the semiconductor layer surface and interface conditions generated with the dielectric film, which allows the resistor body to have a more stable resistance value.

Also, the SOI semiconductor device of the present invention can be formed with conventional MOS or CMOS processes without requiring any special processes. Therefore, complicated fabrication processes and an increased fabrication cost can be prevented.

In addition, in accordance with the SOI semiconductor device of the present invention, an RC delay line is constructed wherein the resistor body and the capacitance are connected together and controlled by voltage. This RC delay line, therefore, has the pulse width and the like which are easily controlled, and can be applied to a wide variety of use as with the case of a common RC delay line.

What is claimed is:

1. A SOI semiconductor device comprising:

a resistor body which is formed of a top semiconductor layer in a SOI substrate, the SOI substrate including an embedded dielectric film and the top semiconductor layer of the SOI substrate being formed on the embedded dielectric film and being electrically isolated by an insulating film which at least partially surrounds the top semiconductor layer, wherein a resistance value of the resistor body is determined by the concentration of impurities contained in the top semiconductor layer and by the dimension of the resistor body, and wherein sufficient impurities are provided in the resistor body so that the resistor body is partially depleted so that a non-depleted region is provided therein between the embedded dielectric film and a bottom edge of a depletion region of the top semiconductor layer under at least a control electrode which is provided over at least part of the resistor body.

2. A device as set forth in claim 1, wherein the resistor body is 80 nm to 200 nm thick, 10 $\mu$m to 1000 $\mu$m wide and 0.2 $\mu$m to 10 $\mu$m long.

3. A device as set forth in claim 1, wherein the impurity concentration of the resistor body is $1 \times 10^{17}$ cm$^{-3}$ to $5 \times 10^{18}$ cm$^{-3}$.

4. A device as set forth in claim 1, wherein the specific resistance of the resistor body is set to be 0.04 $\Omega$·cm to 0.2 $\Omega$·cm.

5. A device as set forth in claim 1, wherein the resistance value of the resistor body is controlled to be 1 k$\Omega$ to 100 M$\Omega$.

6. A device as set forth in claim 1, wherein the control electrode is capacitively coupled with the resistor body via a dielectric film, wherein the resistor body is partially depleted in a manner so as to form a neutral region through which electric current flows and the resistance value of the resistor body is varied by a voltage applied to the control electrode.

7. A device as set forth in claim 6, wherein the resistance value of the resistor body is controlled to be 1 k$\Omega$ to 100 M$\Omega$.

8. A device as set forth in claim 1 or 6, wherein the resistor body is used for formation of an electrically variable RC delay line.

9. A SOI semiconductor device comprising:

an electrically variable resistor body which is formed of a top semiconductor layer in a SOI substrate, the SOI substrate comprising an embedded dielectric film and the top semiconductor layer formed on the embedded dielectric film and which has a control electrode disposed on the top semiconductor layer with intervention of a dielectric film, wherein the resistor body is partially depleted by the control electrode to form a neutral region through which electric current flows, the resistor body has highly concentrated diffusion layers of a first conductive type at both ends in a conduction direction, both side walls of the resistor body along the conduction direction are junction-isolated by highly concentrated diffusion layers of a second type, and wherein the highly concentrated diffusion layers of the second conductivity type along the both side walls of the resistor body are connected together and grounded.

10. A device as set forth in claim 9, wherein the resistance value of the resistor body is controlled to be 1 kΩ to 100 MΩ.

11. A device as set forth in claim 9, wherein the resistor body is used for formation of an electrically variable RC delay line.

12. A SOI semiconductor device comprising:

an electrically variable resistor body which is formed of a top semiconductor layer in a SOI substrate, the SOI substrate comprising an embedded dielectric film and the top semiconductor layer formed on the embedded dielectric film, wherein the resistor body is partially depleted by the control electrode to form a neutral region through which electric current flows, so that a non-depleted region is provided in the resistor body between the embedded dielectric film and a bottom edge of a depletion region of the top semiconductor layer, the resistor body has highly concentrated diffusion layers of a first conductive type at both ends in a conduction direction, both side walls of the resistor body along the conduction direction are junction-isolated by highly concentrated diffusion layers of a second type, and an I-shaped control electrode disposed on the top semiconductor layer with intervention of a dielectric film so that application of voltage to the control electrode can alter resistance of the resistor body.

* * * * *